United States Patent
O'Mahony et al.

(10) Patent No.: US 7,352,059 B2
(45) Date of Patent: Apr. 1, 2008

(54) LOW LOSS INTERCONNECT STRUCTURE FOR USE IN MICROELECTRONIC CIRCUITS

(75) Inventors: Frank O'Mahony, San Carlos, CA (US); Mark A. Anders, Hillsboro, OR (US); Krishnamurthy Soumyanath, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/152,643

(22) Filed: Jun. 14, 2005

(65) Prior Publication Data

US 2005/0227507 A1    Oct. 13, 2005

Related U.S. Application Data

(62) Division of application No. 09/893,023, filed on Jun. 27, 2001, now Pat. No. 6,909,127.

(51) Int. Cl.
*H01L 27/10* (2006.01)
*H01L 23/52* (2006.01)
*H01L 23/522* (2006.01)
*H01R 12/00* (2006.01)

(52) U.S. Cl. ............... 257/691; 257/E23.144; 257/208; 257/758; 257/775; 257/776; 257/664; 257/211; 257/E23.011; 439/65; 327/295

(58) Field of Classification Search ........ 257/E23.144, 257/208, 776, 758, 691, 775, 207, 211, 663, 257/662, 661, 664, E23.011; 439/65; 327/295; 333/32–34
See application file for complete search history.

(56) References Cited

U.S. PATENT DOCUMENTS

| | | | |
|---|---|---|---|
| 5,387,885 A | 2/1995 | Chi | |
| 5,397,943 A | 3/1995 | West et al. | |
| 5,410,491 A | 4/1995 | Minami | |
| 5,497,109 A | 3/1996 | Honda et al. | |

(Continued)

FOREIGN PATENT DOCUMENTS

| | | |
|---|---|---|
| EP | 1376747 A2 | 1/2004 |
| JP | 1-289155 | 11/1989 |
| JP | 2-158165 | 6/1990 |

OTHER PUBLICATIONS

Bakoglu, H B., "Circuits, Interconnections, and Packaging for VLSI", *Reading, Mass. : Addison-Wesley Pub. Co.*, (1990),Table of Contents.

(Continued)

*Primary Examiner*—Alexander Oscar Williams
(74) *Attorney, Agent, or Firm*—Schwegman, Lundberg & Woessner, P.A.

(57) ABSTRACT

A low loss on-die interconnect structure includes first and second differential signal lines on one of the metal layers of a microelectronic die. One or more traces may also be provided on another metal layer of the die that are non-parallel (e.g., orthogonal) to the differential signal lines. Because the traces are non-parallel, they provide a relatively high impedance return path for signals on the differential signal lines. Thus, a signal return path through the opposite differential line predominates for the signals on the differential lines. In one application, the low loss interconnect structure is used within an on-die salphasic clock distribution network.

18 Claims, 4 Drawing Sheets

U.S. PATENT DOCUMENTS

| | | | |
|---|---|---|---|
| 5,519,351 | A | 5/1996 | Matsumoto |
| 5,521,541 | A | 5/1996 | Okamura |
| 5,570,045 | A | 10/1996 | Erdal et al. |
| 5,668,484 | A | 9/1997 | Nomura |
| 5,691,662 | A | 11/1997 | Soboleski et al. |
| 5,717,229 | A | 2/1998 | Zhu |
| 5,761,253 | A | 6/1998 | Fujita et al. |
| 5,969,559 | A | 10/1999 | Schwartz |
| 6,005,428 | A | 12/1999 | Amdahl |
| 6,037,822 | A | 3/2000 | Rao et al. |
| 6,043,704 | A | 3/2000 | Yoshitake |
| 6,144,224 | A | 11/2000 | Lee et al. |
| 6,150,865 | A | 11/2000 | Fluxman et al. |
| 6,157,688 | A | 12/2000 | Tamura et al. |
| 6,184,736 | B1 | 2/2001 | Wissell et al. |
| 6,198,307 | B1 | 3/2001 | Garlepp et al. |
| 6,211,714 | B1 | 4/2001 | Jeong |
| 6,239,387 | B1 | 5/2001 | Wissell |
| 6,255,884 | B1 | 7/2001 | Lewyn |
| 6,311,313 | B1 | 10/2001 | Camporese et al. |
| 6,323,714 | B1 | 11/2001 | Naffziger et al. |
| 6,397,375 | B1 | 5/2002 | Block et al. |
| 6,411,151 | B1 | 6/2002 | Nair et al. |
| 6,420,663 | B1 | 7/2002 | Zelikson et al. |
| 6,429,714 | B1 | 8/2002 | Schultz |
| 6,532,544 | B1 | 3/2003 | Masleid et al. |
| 6,556,089 | B2 | 4/2003 | Wood |
| 6,570,429 | B1 | 5/2003 | Hellriegel |
| 6,624,719 | B1 | 9/2003 | Anderson et al. |
| 6,690,570 | B2 * | 2/2004 | Hajimiri et al. ......... 361/306.1 |
| 6,781,236 | B2 * | 8/2004 | Shimooka et al. .......... 257/758 |
| 2002/0083359 | A1 | 6/2002 | Dow |
| 2002/0190775 | A1 | 12/2002 | Magoshi |
| 2003/0001652 | A1 | 1/2003 | O'Mahony et al. |

OTHER PUBLICATIONS

Bernstein, K , et al., *High Speed CMOS Design Styles*, Kluwer Academic Publishers,(1998),Table of Contents.

Chi, V. L., "Salphasic Distribution of Clock Signals for Synchronous Systems", *IEEE Transactions on Computers*, 43, (May 1994),597-602.

Restle, Phillip , et al., "Designing the Best Clock Distribution Network", *IEEE Symposium on VLSI Circuits Digest of Technical Papers*, (1998),2-5.

"U.S. Appl. No. 09/893,067 Final Office Action mailed May 22, 2002", 6 pgs.

"U.S. Appl. No. 09/893,023 Final Office Action mailed Jul. 16, 2003", 8 pgs.

"U.S. Appl. No. 09/893,023 Final office action mailed Dec. 3, 2004", 7 pgs.

"U.S. Appl. No. 09/893,023 Non-final office action mailed Jan. 22, 2004", 6 pgs.

"U.S. Appl. No. 09/893,023 Non-final office action mailed Jun. 29, 2004", 6 pgs.

"U.S. Appl. No. 09/893,023 Notice of allowance mailed Feb. 18, 2005", 7 pgs.

"U.S. Appl. No. 09/893,067 Notice of Allowance mailed Oct. 1, 2002", 9 pgs.

"U.S. Appl. No. 09/893,023 Response filed Mar. 24, 2004 to non-final office action mailed Jan. 22, 2004", 12 pgs.

"U.S. Appl. No. 09/893,023 Response filed Sep. 10, 2004 to non-final office action mailed Jun. 29, 2004", 12 pgs.

"U.S. Appl. No. 09/893,023 Non-Final Office Action mailed Jan. 3, 2003", 7 pgs.

"U.S. Appl. No. 09/893,023 Response filed Jan. 26, 2005 in response to Final Office Action mailed Dec. 3, 2004", 9 pgs.

"U.S. Appl. No. 09/893,023 Response filed Apr. 29, 2003 in response to Non-Final Office Action mailed Jan. 3, 2003", 10 pgs.

"U.S. Appl. No. 09/893,023 Response filed Aug. 29, 2003 in response to Final Office Action mailed Jul. 16, 2003", 10 pgs.

"U.S. Appl. No. 09/893,023 Response filed Oct. 15, 2003 in response to Final Office Action mailed Jul. 16, 2003", 10 pgs.

"U.S. Appl. No. 09/893,067 Non-Final Office Action mailed Jan. 16, 2002", 6 pgs.

"U.S. Appl. No. 09/893,067 Response filed Mar. 13, 202 in response to Non-Final Office Action mailed Jan. 16, 2002", 8 pgs.

"U.S. Appl. No. 09/893,067 Response filed Jul. 22, 2002 in response to Final Office Action mailed May 22, 2002", 9 pgs.

* cited by examiner

LOW LOSS INTERCONNECT STRUCTURE FOR USE IN MICROELECTRONIC CIRCUITS

RELATED APPLICATION(S)

This application is a Divisional of U.S. application Ser. No. 09/893,023 filed Jun. 27, 2001, now U.S. Pat. No. 6,909,127, which is incorporated herein by reference.

FIELD OF THE INVENTION

The invention relates generally to microelectronic circuits and, more particularly, to interconnect structures for use therein.

BACKGROUND OF THE INVENTION

Microelectronic devices generally include many on-die interconnects to provide signal delivery and distribution functions for the circuitry. These interconnects are typically used to carry, for example, clock signals, power signals, and/or data signals to various points on the die. In the past, the loss within these on-die interconnects was not a primary concern. Instead, the interconnects were designed to prevent ringing and other signal compromising effects. The loss within on-die interconnects, however, is now becoming a greater concern. For example, one low skew clocking strategy that is currently being considered for use within microelectronic devices is salphasic clocking. Salphasic clocking uses standing waves on a transmission medium to distribute a clock signal in a relatively low skew manner. To generate standing waves that are adequate to support salphasic clocking, however, transmission structures having relatively low loss are typically required. For this and other reasons, there is a need for low loss interconnect structures that can be implemented on-die within a microelectronic device.

DETAILED DESCRIPTION

Figure 1:
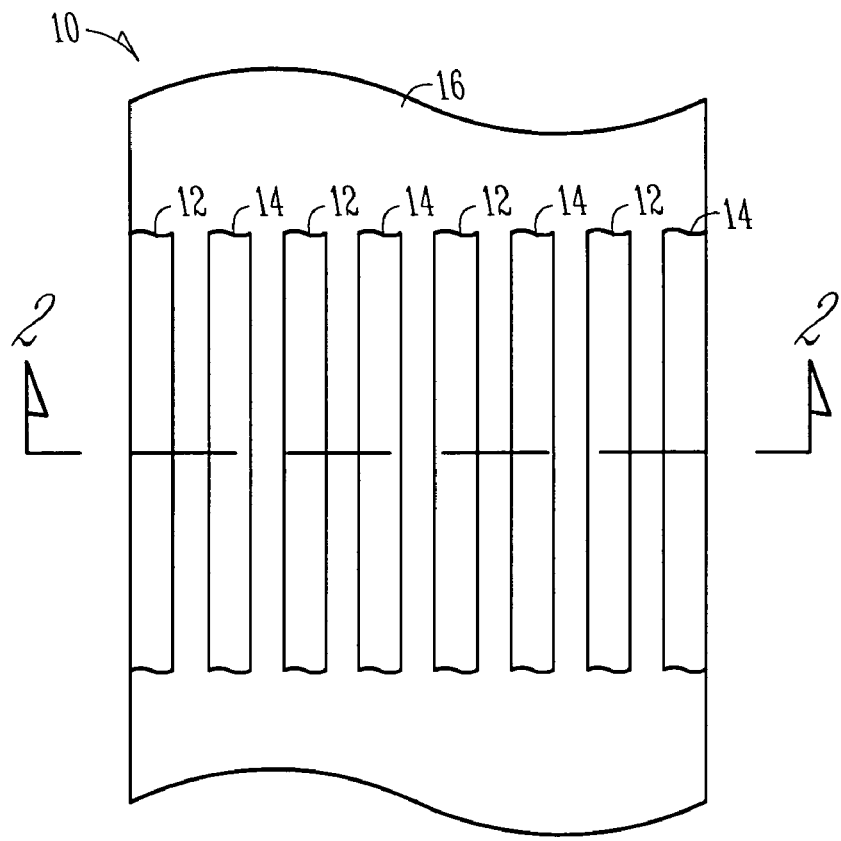
FIGS. 1 and 2 are a top view and a sectional side view, respectively, of a conventional interleaved on-die interconnect structure.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

The present invention relates to a low loss interconnect structure that can be implemented on-die within a microelectronic device. The interconnect structure can be used to replace many of the various interconnects commonly implemented on-die, particularly those used in resonance applications. In clocking networks, for example, the structure can be used to provide, point-to-point connections, tree structures, and/or various grid hierarchies. Because of its low loss, the interconnect structure is particularly beneficial when used as part of a salphasic clock distribution network within a microelectronic circuit. As is well known, the use of low loss transmission structures in salphasic systems can result in significantly lower clock skews within a system.

Figure 2:
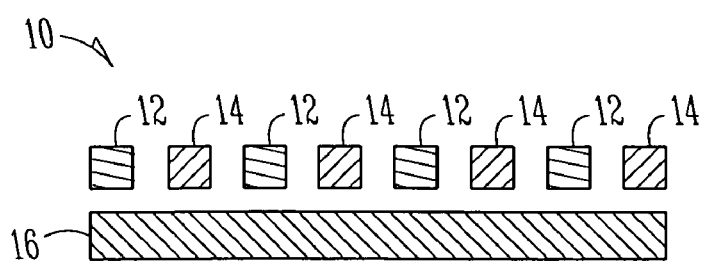

Clocking networks and other on-die signal distribution structures have traditionally been characterized as simple resistance-capacitance (RC) networks. One goal when designing such networks, therefore, has been to minimize circuit inductance. One method to minimize inductance is to place conductive signal return structures close to the signal lines to reduce the size of the effective inductive loop. This technique is enhanced by interleaving signal traces with return traces on the same metal layer of the die. FIGS. 1 and 2 are a top view and a sectional side view, respectively, of a conventional interleaved interconnect structure 10 that incorporates these principles. As illustrated, the interconnect structure 10 includes a plurality of signal traces 12 that are interleaved on a common metal layer with a plurality of return traces 14. A wide parallel return member 16 is located on a layer below the interleaved traces 12, 14. The return member 16 runs parallel to the signal and return traces 12, 14 and has a width that is the same as or similar to the total width of the interleaved traces. Another wide parallel return trace (not shown) can also be provided above the interleaved traces 12, 14 to further reduce series inductance. The return traces 14 and the wide return member 16 can be, for example, power or ground structures within the microelectronic die. Often, further inductance reduction will be undertaken for an interconnect by increasing the resistance and capacitance associated with the structure. Resistance can be increased significantly by decreasing the signal conductor width to less than twice the skin depth of the lines. Capacitance can be increased by adding additional interleaved conductors to the interconnect 10. All of these techniques, however, serve to increase the overall signal loss of the interconnect. As described above, future devices will require less signal loss on the individual interconnects of the device.

Figure 3:
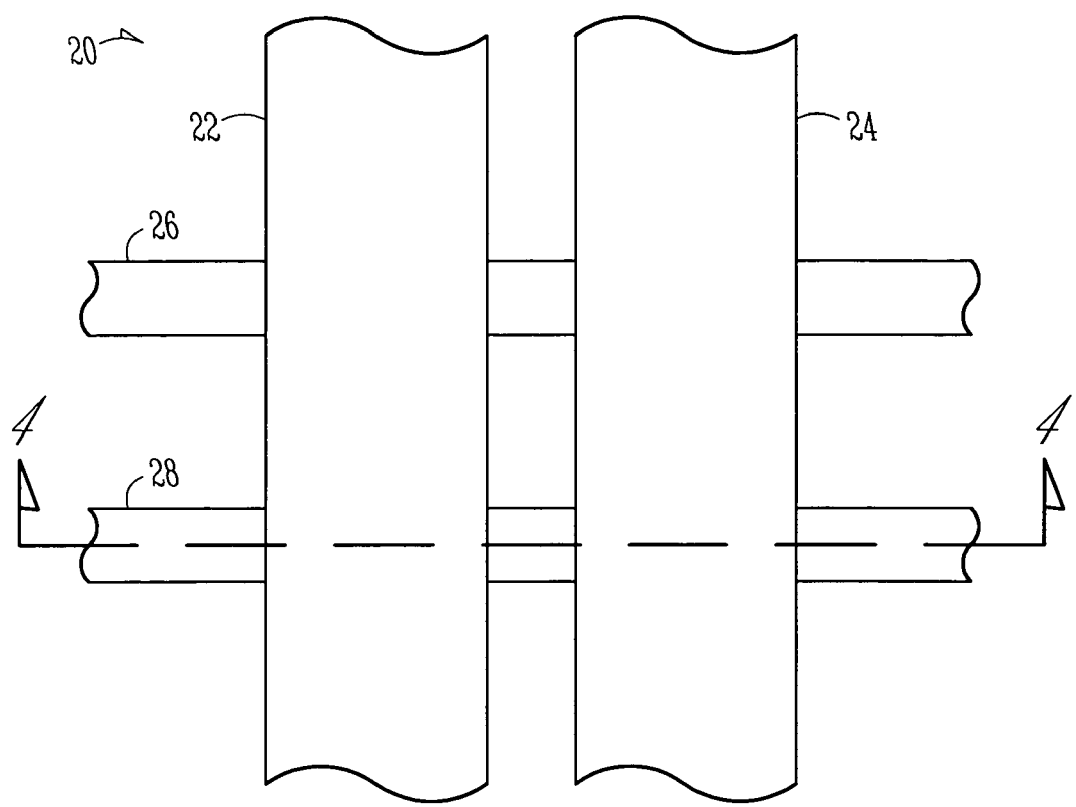
FIGS. 3 and 4 are a top view and a sectional side view, respectively, of a low loss on-die interconnect structure in accordance with one embodiment of the present invention.
Figure 4:
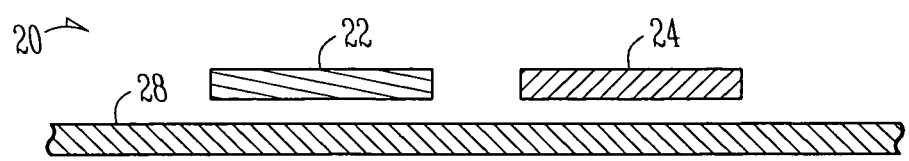

FIGS. 3 and 4 are a top view and a sectional side view, respectively, of a low loss interconnect structure 20 in accordance with one embodiment of the present invention. The low loss interconnect structure 20 can be implemented, for example, on-die within a microelectronic device (e.g., a microprocessor, a chip set, etc.). The interconnect structure 20 includes first and second differential signal lines 22, 24 on a first metal layer to carry a differential signal within the device. The interconnect structure 20 may also include one or more orthogonal traces 26, 28 on another metal layer to provide a possible return path for signal components on the first and second differential signal lines 22, 24. In a microelectronic die, wire directions typically alternate on each successive metal layer. To implement the conventional interconnect structure 10 of FIGS. 1 and 2, therefore, this convention must be broken to allow the wide return member 16 to be parallel with the interleaved signal and return traces 12, 14. Using the interconnect structure 20 of FIGS. 3 and 4, however, allows the convention to be followed by allowing orthogonal lines 26, 28 to be present on the adjacent metal layers. The orthogonal lines 26, 28 can include, for example, signal or power lines within the microelectronic device. As will be discussed in greater detail, the orthogonal lines 26, 28 may also provide a return path for signals propagating on the differential signal lines 22, 24.

The attenuation coefficient ($\alpha$) of a transmission line can be represented by the following equation:

$$\alpha = Re\sqrt{((R+j\omega L)(G+j\omega C))}$$

where R is the series resistance per unit length, L is the series inductance per unit length, G is the shunt conductance per unit length, and C is the shunt capacitance per unit length. In conceiving the present invention, it was appreciated that the loss of a transmission line could be reduced significantly by decreasing R/L without significantly increasing C. In the interconnect structure 20 of FIGS. 3 and 4, the orthogonal traces 26, 28 on the lower metal layer are capacitively coupled to the differential signal traces 22, 24. However, because they are orthogonal to the signal traces 22, 24, the orthogonal traces 26, 28 present a high impedance (e.g., high inductance) return path to signal components propagating on the differential signal traces 22, 24. For this reason, the best return path for each differential signal trace 22, 24 is through the other differential signal trace 24, 22. As desired, this high inductance return path serves to decrease the value of R/L. Further reduction in the value of R/L is achieved by making the signal traces 22, 24 relatively wide to reduce R within the interconnect 20. In one design approach, a reasonable inter-line spacing is initially chosen for the differential signal traces 22, 24. The widths of the differential signal traces 22, 24 are then increased until the corresponding increase in capacitance begins to increase the loss of the interconnect 20. The spacing between the differential signal traces 22, 24 is then increased from the initial value until the additional decrease in loss due to the increase in inductance no longer justifies the increased area consumed by the interconnect 20. One or more additional design iterations may then be performed to further optimize the widths and/or spacing of the traces 22, 24.

Because the interconnect 20 of FIGS. 3 and 4 is a differential structure, it is capable of rejecting common mode noise within a microelectronic device. To support differential operation, the drivers, receivers, and repeaters (if any) used in connection with the interconnect 20 should be differential structures. In one implementation, an interconnect using the inventive principles achieved a loss of 0.790 decibels per millimeter (dB/mm) and a phase constant of 0.885 radians/mm at an operational frequency of 10 gigahertz (gHz). In contrast, a conventional interconnect (e.g., interconnect 10 of FIG. 1) having similar dimensions and materials produces a loss of 1.867 dB/mm and a phase constant of 0.610 radians/mm at 10 gHz.

Figure 5:
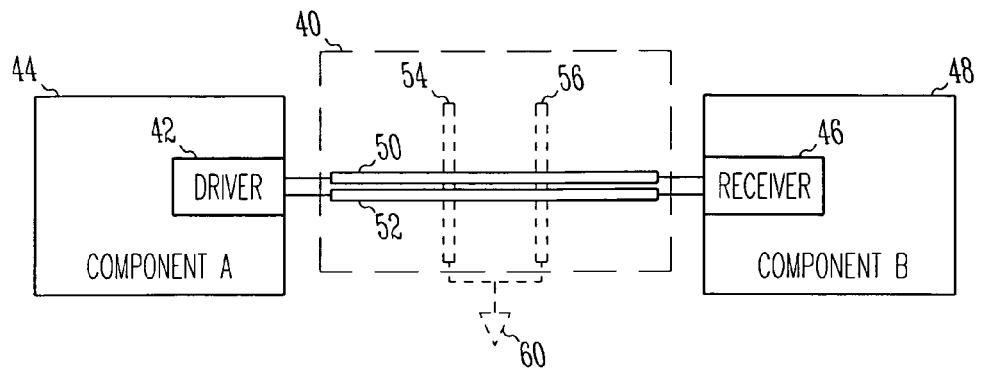
FIG. 5 is a block diagram illustrating the use of a low loss on-die interconnect structure as a point to point communication link within a microelectronic device in accordance with one embodiment of the present invention.

FIG. 5 is a block diagram illustrating the use of a low loss on-die interconnect structure 40 to provide a point to point connection within a microelectronic device in accordance with one embodiment of the present invention. As illustrated, a differential driver 42 associated with a first electrical component 44 (COMPONENT A) is coupled to a first end of the interconnect 40 to provide a differential signal (e.g., a clock or data signal) to the interconnect 40 for transmission to a second electrical component 48 (COMPONENT B). A differential receiver 46 within the second electrical component 48 receives the differential signal from the interconnect 40 for use by circuitry within the second component 48. As shown, the interconnect 40 includes first and second differential signal lines 50, 52 that are located on a common metal layer of the associated die. A pair of orthogonal traces 54, 56 are located on a different metal layer of the die. Although only two orthogonal traces 54, 56 are illustrated, it should be appreciated that any number of such traces may be situated below the differential lines 50, 52. Orthogonal traces may also be present on a metal layer above the differential lines 50, 52. In the illustrated embodiment, the orthogonal traces 54, 56 are coupled to a ground terminal 60 on the die. It should be understood, however, that the orthogonal traces 54, 56 can alternatively be used as, for example, power and/or signal lines. As described above, in the illustrated embodiment, the traces 54, 56 are orthogonal to the differential signal lines 50, 52. In at least one embodiment, however, the traces 54, 56 are at an oblique angle to the differential signal lines 50, 52 (i.e., they are neither orthogonal nor parallel to the signal lines 50, 52).

In at least one application, the low loss interconnect structure of the present invention is used within a salphasic clock network. Salphasic clocking uses standing waves on a transmission medium to distribute a clock signal to multiple points within a system with relatively low skew. Standing waves are created on a transmission line whenever a signal propagating on the transmission line encounters an impedance mismatch on the line. To purposely create a standing wave on a transmission line, an open or short circuit is typically used to terminate the line. When the transmission line is lossless, the standing wave will include a plurality of zero magnitude minima along the length of the transmission line that are located at half wavelength (i.e., $\lambda/2$) intervals. These minima mark the locations of abrupt 180 phase changes in the corresponding signal. In each region between adjacent minima, the phase of the corresponding signal is constant. Thus, to some extent, the phase of the signal has been made non-position dependent. It is this non-position dependent phase quality of the standing wave that is taken advantage of in salphasic clocking.

Figure 6:
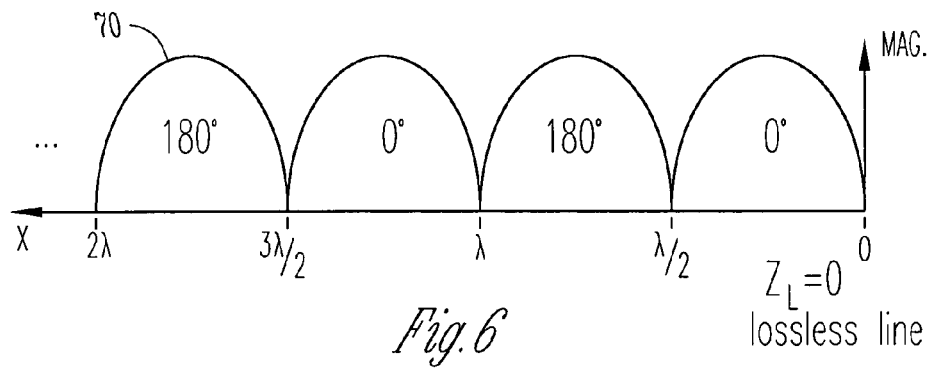
FIG. 6 is a diagram illustrating a standing wave on a lossless transmission line terminated in a short circuit.
Figure 7:
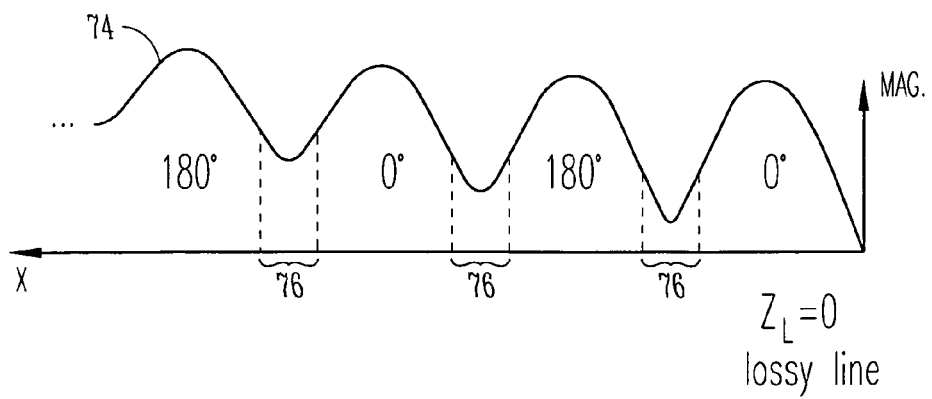
FIG. 7 is a diagram illustrating a standing wave on a lossy transmission line terminated in a short circuit.

FIG. 6 is a diagram illustrating a standing wave 70 that results when a lossless transmission line is terminated in a short circuit. As described above, the standing wave 70 includes zero magnitude minima at half wavelength intervals along the line. Because the termination is a short circuit, a zero magnitude minima is also present at the termination point (i.e., at x=0). As shown, the signal phase at all points between x=0 and x=$\lambda/2$ and between x=$\lambda$ and x=$3\lambda/2$ is zero degrees. Similarly, the signal phase at all points between x=$\lambda/2$ and x=$\lambda$ and between x=$3\lambda/2$ and x=$2\lambda$ is 180 degrees. FIG. 7 is a diagram illustrating a standing wave 74 that results when a lossy transmission line is terminated in a short circuit. As shown, the minima of the standing wave pattern do not occur at zero magnitude as with the lossless line. In addition, an abrupt phase change is not achieved at half wavelength intervals. Instead, a relatively wide region 76 exists at half wavelength intervals where a gradual phase change between zero and 180 degrees takes place. As can be appreciated, the presence of these large phase change regions 76 can significantly increase skew within a corresponding clock network. For this reason, low loss transmission structures are highly desired within salphasic clock networks.

As described previously, in the past, on-die interconnects were typically relatively lossy structures. Thus, these structures were not optimal for use in salphasic clocking networks. The interconnect structure of the present invention, however, is capable of achieving losses that are low enough to make on-die salphasic clocking feasible. In at least one embodiment, the effective loss of the low loss interconnect structure is reduced even further by placing active elements at various locations within the structure (e.g., at various points within a grid) to provide signal gain. Negative impedance converter circuits can be used to reduce the skew proportionally to the decrease in loss. The inventive interconnect structure can be implemented in a variety of different salphasic clock distribution schemes, including salphasic tree structures (e.g., H trees and binary trees) and salphasic grid structures.

Figure 8:
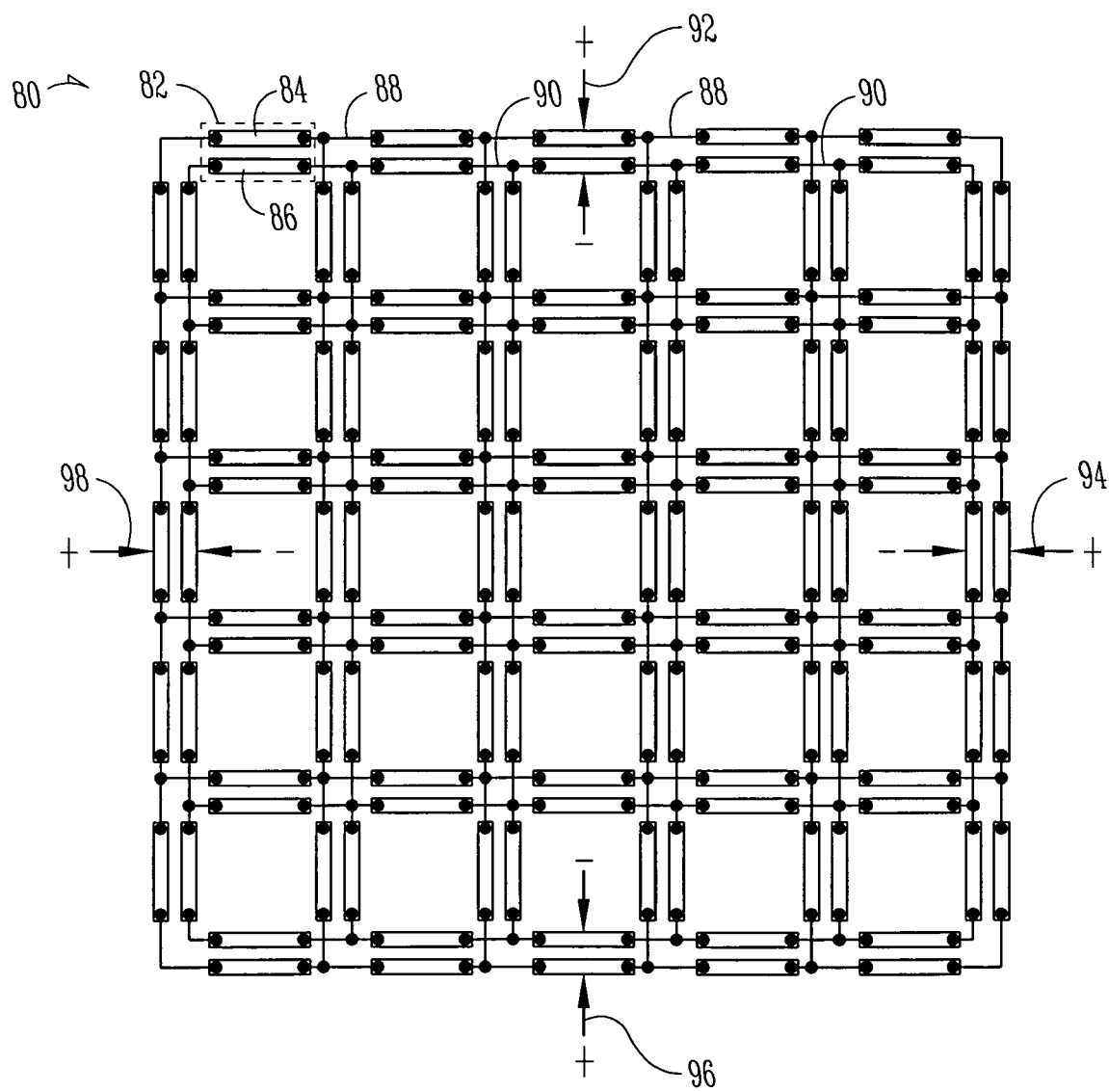
FIG. 8 is a block diagram illustrating the use of a low loss on-die interconnect structure within a salphasic clock grid to provide salphasic clock distribution within a microelectronic device in accordance with one embodiment of the present invention.

FIG. 8 is a diagram illustrating a salphasic clock grid 80 that is implemented on-die in accordance with one embodiment of the present invention. As illustrated, the salphasic clock grid 80 includes a number of interconnect segments 82 that each include first and second differential signal line portions 84, 86. The interconnect segments 82 are connected together in a grid pattern that is used to distribute a clock signal to a number of loads (i.e., clocked elements) within a corresponding microelectronic device. The first differential signal line portion 84 of each interconnect segment 82 is conductively coupled to the first differential signal line portion 84 of each other interconnect segment 82 of the grid 80 using conductive links 88. Similarly, the second differential signal line portion 86 of each interconnect segment 82 is conductively coupled to the second differential signal line portion 86 of each other interconnect segment 82 of the grid 80 using conductive links 90. The conductive links 88, 90 will typically include trace portions on other layers of the die (and corresponding via connections). As described previously, orthogonal traces may be present on metal layers adjacent to the grid 80 to be used as, for example, power, ground, and/or signal lines.

In the illustrated embodiment, the salphasic clock grid 80 is fed a differential clock signal at four different locations 92, 94, 96, 98 on the grid 80. Buffer units having small signal, differential outputs can be used to drive the grid 80 at these locations. The salphasic clock grid 80 will generate standing waves using the differential clock signal. The resulting standing wave pattern will depend on a number of factors including: the phasing of the four drive signals, the dimensions of the grid 80, and the frequency of the clock signal. The standing wave pattern will have large regions where clock signal phase is position independent. Thus, the loads can be connected to the grid anywhere within these regions to achieve low skew. In at least one embodiment, the signal phase is position independent for the entire grid 80. In a preferred approach, a sinusoidal clock signal is used to simplify phase detection at the load locations, although other clock signal types can alternatively be used. As the reader will appreciate, the inventive interconnect structure can be implemented in a variety of other on-die salphasic clock distribution structures.

Although the present invention has been described in conjunction with certain embodiments, it is to be understood that modifications and variations may be resorted to without departing from the spirit and scope of the invention as those skilled in the art readily understand. Such modifications and variations are considered to be within the purview and scope of the invention and the appended claims.

What is claimed is:

1. A low loss interconnect structure on a microelectronic die, comprising:
first and second differential signal lines formed on a first metal layer of the microelectronic die and configured to carry a differential signal within the microelectronic die, the first and the second differential signal lines being substantially parallel to one another, a selected one of the first and the second differential signal lines being operable to provide a return path for a signal on the other one of the first and the second differential signal lines, the structure further including a trace formed on a second metal layer proximate to the first metal layer, wherein the trace is non-conductively coupled and non-parallel to the first and second differential signal lines, and wherein the return path on the selected one of the first and second differential signal lines being a predominant return path for the signal.

2. The structure of claim 1, wherein the trace on a second metal layer of the microelectronic die is capacitively coupled to the second differential signal lines.

3. The structure of claim 1, wherein the trace is substantially orthogonal to the first and the second differential signal lines.

4. The structure of claim 1, wherein the trace includes a data line.

5. The structure of claim 1, wherein the trace includes a power line.

6. The structure of claim 1, wherein the second metal layer is adjacent to the first metal layer.

7. The structure of claim 1, wherein the microelectronic die includes multiple traces that are substantially parallel to one another.

8. The of structure claim 1, wherein the trace provides a return path for a signal on the first differential signal line that has a significantly higher impedance than a return path provided by the second differential signal line.

9. The structure of claim 1, wherein the first and the second differential signal lines provide a point to point signal connection within the microelectronic die.

10. The structure of claim 1, wherein the first and the second differential signal lines are part of a clock distribution network to distribute a clock signal within the microelectronic die.

11. The structure of claim 10, wherein the clock distribution network uses salphasic clocking techniques to distribute the clock signal.

12. The structure of claim 10, wherein the clock distribution network includes a clock network to generate, using the clock signal, a standing wave pattern for use in performing salphasic clocking, the first and the second differential signal lines being part of the clock grid.

13. The structure of claim 1, wherein the first and the second differential signal lines further comprise a salphasic clock grid having a plurality of interconnect segments that are operable to distribute a clock signal to a plurality of clocked elements within the microelectronic die.

14. The structure of claim 13, wherein the plurality of interconnect segments in the salphasic clock grid are coupled by conductive links that include trace portions formed on a layer of the microelectronic die other than a layer of the die that includes the interconnect segments.

15. The structure of claim 14, wherein the conductive links further comprise conductive vias that couple the trace portions to the interconnect segments.

16. The structure of claim 13, wherein the salphasic clock grid is coupled to a differential clock signal at predetermined locations on the grid.

17. The structure of claim 16, comprising buffer units having small signal, differential outputs that are coupled to the predetermined locations on the grid.

18. The structure of claim 16, wherein the differential clock signal is a sinusoidal clock signal.

* * * * *

UNITED STATES PATENT AND TRADEMARK OFFICE
CERTIFICATE OF CORRECTION

PATENT NO. : 7,352,059 B2
APPLICATION NO. : 11/152643
DATED : April 1, 2008
INVENTOR(S) : O'Mahony et al.

Page 1 of 1

It is certified that error appears in the above-identified patent and that said Letters Patent is hereby corrected as shown below:

In column 6, line 41, in Claim 8, delete "The of structure" and insert -- The structure of --, therefor.

Signed and Sealed this

Twenty-ninth Day of July, 2008

JON W. DUDAS
*Director of the United States Patent and Trademark Office*